US012628572B2

(12) United States Patent
Kikuchi et al.

(10) Patent No.: US 12,628,572 B2
(45) Date of Patent: May 12, 2026

(54) QUANTUM DEVICE COMPRISING FIRST CONNECTION PORTIONS WITHIN DEFORMATION SUPPRESSION REGION DEFINED BY SECOND CONNECTION PORTIONS

(71) Applicant: NEC Corporation, Tokyo (JP)

(72) Inventors: Katsumi Kikuchi, Tokyo (JP); Akira Miyata, Tokyo (JP); Takanori Nishi, Tokyo (JP); Kenji Nanba, Tokyo (JP); Ayami Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 460 days.

(21) Appl. No.: 18/123,038

(22) Filed: Mar. 17, 2023

(65) Prior Publication Data

US 2023/0309419 A1 Sep. 28, 2023

(30) Foreign Application Priority Data

Mar. 23, 2022 (JP) ................................. 2022-046286

(51) Int. Cl.
*H10N 60/81* (2023.01)
*H10W 72/20* (2026.01)
*H10W 90/00* (2026.01)

(52) U.S. Cl.
CPC .......... *H10N 60/81* (2023.02); *H10W 72/248* (2026.01); *H10W 72/252* (2026.01); *H10W 72/253* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 2014/0225275 A1 | 8/2014 | Shimizu et al. | |
| 2019/0042964 A1* | 2/2019 | Elsherbini | .......... H01L 23/4855 |
| 2019/0194016 A1 | 6/2019 | Roberts et al. | |
| 2019/0229094 A1 | 7/2019 | White | |
| 2019/0273197 A1* | 9/2019 | Roberts | ................. H10N 60/12 |

(Continued)

FOREIGN PATENT DOCUMENTS

| | | |
|---|---|---|
| JP | H08-031976 A | 2/1996 |
| JP | H11-87560 A | 3/1999 |

(Continued)

OTHER PUBLICATIONS

JP Office Action for JP Application No. 2022-046286, mailed on Nov. 25, 2025 with English Translation.

*Primary Examiner* — Daniel Whalen

(74) *Attorney, Agent, or Firm* — Sughrue Mion, PLLC

(57) ABSTRACT

A quantum device includes a chip including a superconducting circuit, a first wiring substrate, a second wiring substrate, first connection portions connecting the chip and a wiring layer on a first surface of the first wiring substrate and second connection portions connecting the second wiring substrate and a wiring layer on a second surface of the first wiring substrate, wherein one or more second connection portions arranged in a first row as viewed from the edge of the first substrate are provided at positions corresponding respectively to one or more of the first connection portions arranged in a first row as viewed from the edge and are arranged closer to the edge than the first connection portions arranged in the first row.

11 Claims, 7 Drawing Sheets

(56)     References Cited

U.S. PATENT DOCUMENTS

2020/0402888  A1      12/2020   Tsutsui et al.
2021/0167271  A1 *     6/2021   Hidaka  .................... H01L 25/07
2021/0313195  A1 *    10/2021   Hsu  ................... H01L 23/49866

FOREIGN PATENT DOCUMENTS

JP            2012-069772  A        4/2012
JP            2014-154800  A        8/2014
JP            2019-537239  A       12/2019
JP            2020-107909  A        7/2020
JP               6789385  B2       11/2020
WO           2018/212041  A1       11/2018
WO           2020/122014  A1        6/2020

* cited by examiner

FIG. 6

42:second bump electrode closest
to the edge of the substrate 21

42: second bump electrode closest
to the edge of the substrate 21

QUANTUM DEVICE COMPRISING FIRST CONNECTION PORTIONS WITHIN DEFORMATION SUPPRESSION REGION DEFINED BY SECOND CONNECTION PORTIONS

CROSS REFERENCE TO RELATED APPLICATIONS

This application is based upon and claims the benefit of the priority of Japanese patent application No. 2022-046286, filed on Mar. 23, 2022, the disclosure of which is incorporated herein in its entirety by reference thereto.

FIELD

This invention relates to a quantum device provided with a superconducting circuit.

BACKGROUND

A quantum chip provided with a superconducting circuit such as a superconducting quantum bit (qubit) and a coupler is formed on a substrate (e.g., silicon substrate) using a semiconductor micro-fabrication process. For pitch narrowing of connection terminals (electrodes) and wiring miniaturization of the quantum chip, the quantum chip is connected to a first wiring substrate (interposer) which performs pitch conversion and wiring routing.

With an increase in the number of connection terminals due to an increase in the number of qubits included in the quantum chip, a connection terminal arranged on a surface facing the quantum chip is connected via a through via to a connection terminal arranged on an opposite side surface of the quantum chip, a signal is transmitted and received from the connection terminal provided on the opposite side surface. In the first wiring substrate (interposer), wiring is formed on a silicon substrate, which is similar to the substrate of a quantum chip. The quantum chip is flip-chip mounted on the first wiring substrate (interposer), with a circuit surface on which qubits are formed, faced down.

In the first wiring substrate (interposer), such a configuration in which a dielectric other than a silicon is placed and a material other than a superconducting material is exposed on a first surface facing the circuit surface of the quantum chip is usually not adopted to prevent degradation of a qubit's transmission characteristic. Therefore, a wiring accommodation ratio of the first wiring substrate (interposer) cannot be increased.

In order to increase a wiring accommodation ratio, for example, a configuration is used in which a plurality of wiring substrates are stacked. In this case, connection terminals on a surface of the first wiring substrate (interposer), opposite to a surface facing to a quantum chip, are directly connected to connection terminals on a first surface of a second wiring substrate (also called a package substrate), facing to the first wiring substrate, where connection to external circuit(s) is made from the connection terminals on a second surface of the second wiring substrate which is opposite to the first surface. As the second wiring substrate, a resin-based multilayer substrate may be used.

In a three-dimensional mounting package composed of a plurality of wiring substrates, where the package includes a quantum chip and an interposer, as a substrate such as the interposer becomes thinner, warping or other deformation of the substrate impairs connection reliability. The warping of the substrate is also caused by a thermal stress due to a difference (mismatch) in coefficients of thermal expansion (coefficient of linear expansion) between materials subjected to thermal history.

Underfill is used to increase a mounting strength (mechanical strength) of a wiring substrate on which a semiconductor chip is flip-chip mounted. An underfill material (e.g., epoxy resin, urethane resin, silicon resin, polyester resin, acrylic resin, etc.) is filled in a gap between the semiconductor chip and the first wiring substrate (interposer) and a gap between the first wiring substrate (interposer) and the second wiring substrate, for stress relaxation (Patent Literature (PTL) 1). However, it is known that circuit characteristics deteriorate in several to several tens of GHz (Gigahertz) band, for example, due to an effect of an underfill material which is an insulating adhesive material used to fix and seal the second wiring substrate and first wiring substrate (interposer). In addition, as described above, an underfill material is not used in the superconducting quantum circuit to avoid characteristic degradation (loss) due to a dielectric. Furthermore, in terms of thermal shrinkage, an underfill material is not used in consideration of occurrence of a warping and/or a stress strain thereof.

[PTL 1] International Publication No. WO2020/122014

SUMMARY

It is an object of the present disclosure to provide a quantum device enabled to suppress deformation or the like of a wiring substrate to improve connection reliability.

According to the present disclosure, a quantum device includes:

a chip including a substrate and a wiring layer made of superconducting material on the substrate;

a first wiring substrate including a first substrate, a first wiring layer including a plurality of wirings formed on a first surface of the first substrate, a second wiring layer formed on a second surface opposite the first surface of the first substrate; and a plurality of through vias penetrating the first substrate and electrically connecting the plurality of wirings on the first wiring layer and a plurality of wirings on the second wiring layer;

a second wiring substrate including a second substrate, and a third wiring layer formed on a first surface of the second substrate;

a plurality of first connection portions that electrically connect a plurality of wirings on the wiring layer of the chip and the plurality of wirings of the first wiring layer on the first surface of the first wiring substrate arranged opposed to the chip; and a plurality of second connection portions that electrically connect the plurality of wirings of the second wiring layer on the second surface of the first wiring substrate and the plurality of wirings of the third wiring layer on the first surface of the second wiring substrate arranged opposed to the second surface of the first wiring substrate.

In the first wiring substrate, the plurality of the second connection portions on the second surface arranged in a first row as viewed from an edge of the first substrate, include one or more second connection portions provided at positions that correspond respectively to one or more of the first connection portions on the first surface arranged in a first row as viewed from the edge of the first substrate and that are closer to the edge than the first connection portions on the first surface arranged in the first row.

According to the present disclosure, it is possible to provide a quantum device that suppresses deformation or the like. of a wiring substrate to improves connection reliability. Still other features and advantages of the present invention will become readily apparent to those skilled in this art from the following detailed description in conjunction with the accompanying drawings where only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 6 is a cross section view schematically illustrating a second wiring substrate of the example embodiment.

EXAMPLE EMBODIMENTS

In a three-dimensionally mounted quantum device package provided with a plurality of wiring substrates in which a quantum chip and an interposer are included, as the substrate such as the interposer becomes thinner, a warping and/or other deformation of the substrate may deteriorate connection reliability.

Underfill cannot be used in a quantum device. Therefore, a new measure (structure or architecture) is desired to be introduced to suppress a warping and/or other deformation of a substrate due to thermal shrinkage and other factors in a three-dimensionally mounted quantum device package. According to the present disclosure, a quantum device is enabled to suppress deformation or the like. of a wiring substrate to improves connection reliability.

Figure 1:
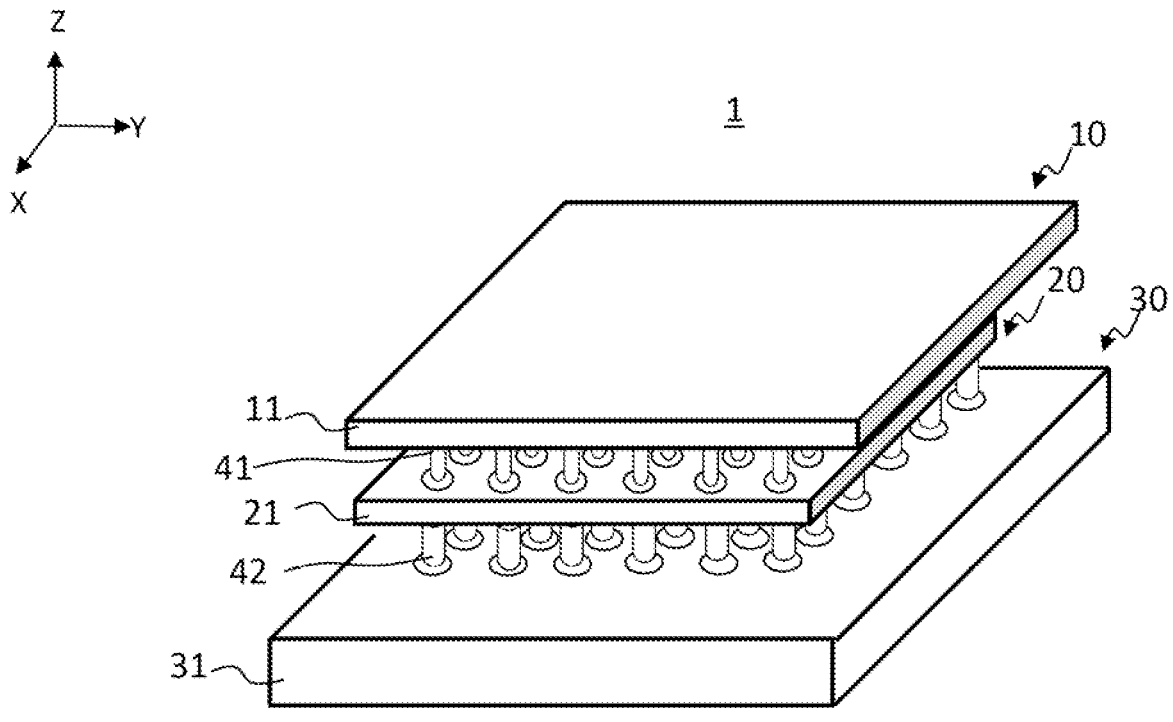
FIG. 1 is a schematic diagram illustrating an example embodiment.

The following describes example embodiments of the present disclosure. FIG. 1 illustrates a quantum device 1 in one of example embodiments. As illustrated in FIG. 1, the quantum device 1 is provided with a quantum chip 10, a first wiring substrate (interposer substrate) 20, and a second wiring substrate 30.

The quantum chip 10 includes a wiring layer, not illustrated in which a superconducting quantum circuit is formed, on a first surface (circuit surface) of a substrate 11. The quantum chip 10 is flip-chip mounted on the first wiring substrate 20 with the first surface faced down. As a non-limiting example, the quantum chip 10 may include a qubit using Josephson junctions (e.g., a Josephson parametric oscillator) as a superconducting quantum circuit.

A wiring on the first surface (circuit surface) of the substrate 11 of the quantum chip 10 and a wiring on a wiring layer on a first surface of the first wiring substrate 20 facing the quantum chip 10 is directly connected (bonded) with a first connection portion 41. The first connection portion 41 is preferably made with a bump electrode (metal bump).

A substrate 21 of the first wiring substrate 20 is preferably made of the same material as the substrate 11 of the quantum chip 10, in consideration of a linear expansion coefficient and so on.

In a case where the substrate 11 of the quantum chip 10 is a silicon substrate, for example, the substrate 21 of the first wiring substrate 20 preferably is made of silicon. In this case, the first wiring substrate 20 is also called a silicon interposer substrate. A wiring layer 12 of the substrate 11 of the quantum chip 10 is manufactured by a semiconductor process (semiconductor micro-fabrication process). The wiring layer of the first wiring substrate 20 (silicon interposer substrate) may also be manufactured by the semiconductor process. In this case, a through via (Through Silicon Via: TSV), which connects a first wiring layer and a second wiring layer of the first wiring substrate penetrating the substrate 11, is also manufactured by the semiconductor process, where the first wiring layer is the wiring layer on the surface of the first wiring substrate 20 facing the quantum chip and the second wiring layer is a wiring layer on an opposite side of the first wiring layer.

The first connection portion (bump electrode) 41 may be manufactured by a semiconductor process (metal film deposition and pattern formation). The first connection portion (bump electrode) 41 may be made of a normal conductor such as copper (Cu) or an insulator ($SiO_2$, silicon nitride film, silicon oxynitride film, etc.) surface-coated with a superconducting film.

The second wiring substrate 30 is directly connected to a wiring on a back surface of the first wiring substrate 20 (a second surface opposite to the first surface facing the quantum chip 10) with a second connection portion 42. The second connection portion 42 is preferably made with a bump electrode (metal bump).

The second wiring substrate 30 is suitably configured to have a size (area) and thickness each larger than that of the first wiring substrate 20, for pitch conversion, wiring routing, etc., though not limited thereto. The second wiring substrate 30 may be configured with a multilayer silicon interposer substrate with insulation and conductor layers alternatingly provided on both sides of a core material, a resin-based multilayer substrate, a ceramic substrate, a tape substrate or the like. The second wiring substrate 30 is also called a package substrate or an interposer substrate (second interposer substrate). The second surface of the second wiring substrate 30, opposite to the first surface facing the first wiring substrate 20, may be provided with a connection terminal(s) to connect to a wiring on the first surface with a through via etc.

According to the present example embodiment, in the first wiring substrate 20, on a surface (second surface) of an opposite side of a surface (first surface) facing the quantum chip 10, among the plurality of second connection portions (bump electrodes) 42 arranged in a first row on the second surface as viewed from an edge of the substrate 21, one or more second connection portions (bump electrodes) 42 are arranged at one or more positions on the second surface which correspond to one or more of the first connection portions (bump electrodes) 41 arranged in a first row on the first surface as viewed from an edge of the substrate 21, respectively, and which are closer to the edge than the corresponding one or more positions of the first connection portions (bump electrodes) 41 arranged in the first row on the first surface. The configuration of the plurality of the second connection portions (bump electrodes) 42 in the first row as viewed from the edge of the substrate 21 is not limited to one in which the second connection portions are aligned and arranged in the same line along the X-axis or Y-axis direction of FIG. 1 on the second surface of the substrate 21. The configuration of the second connection portions (bump electrodes) 42 may include one in which the second connection portions are not aligned on the same line, but each of the second connection portions is positioned first (closest to the edge) as viewed from the edge of the substrate 21. The same may be said to the first connection portions (bump electrodes) 41 arranged in the first row on the first surface as viewed from the edge of the substrate 21.

As illustrated in FIG. 1, there is no encapsulant (insulating adhesive material) such as an underfill material between the quantum chip 10 and the first wiring substrate 20 and between the first wiring substrate 20 and the second wiring substrate 30. In a vacuum-evacuated refrigerator, a gap between the quantum chip 10 and the first wiring substrate 20 and a gap between the first wiring substrate 20 and the second wiring substrate 30 are each in a vacuum.

Only for the sake of simplicity of the drawing, in FIG. 1, a height of the first connection portion (bump electrode) 41 is illustrated as larger than a thickness of the quantum chip 10 and the first wiring substrate 20. As a non-limiting example, the thickness of the quantum chip 10 (silicon chip) and that of the first wiring substrate 20 (silicon interposer substrate) are about 30 to several hundred μm (micrometer) (30 μm or more), for example, and the height of the first connection portion (bump electrode) 41 is, for example, about 1 to several 10 μm (1 μm or more).

In FIG. 1, the number of the first wiring substrate 20 mounted on the second wiring substrate 30 is one, but a plural number of the first wiring substrates 20 may, as a matter of course, be mounted on the second wiring substrate 30.

Figure 2:
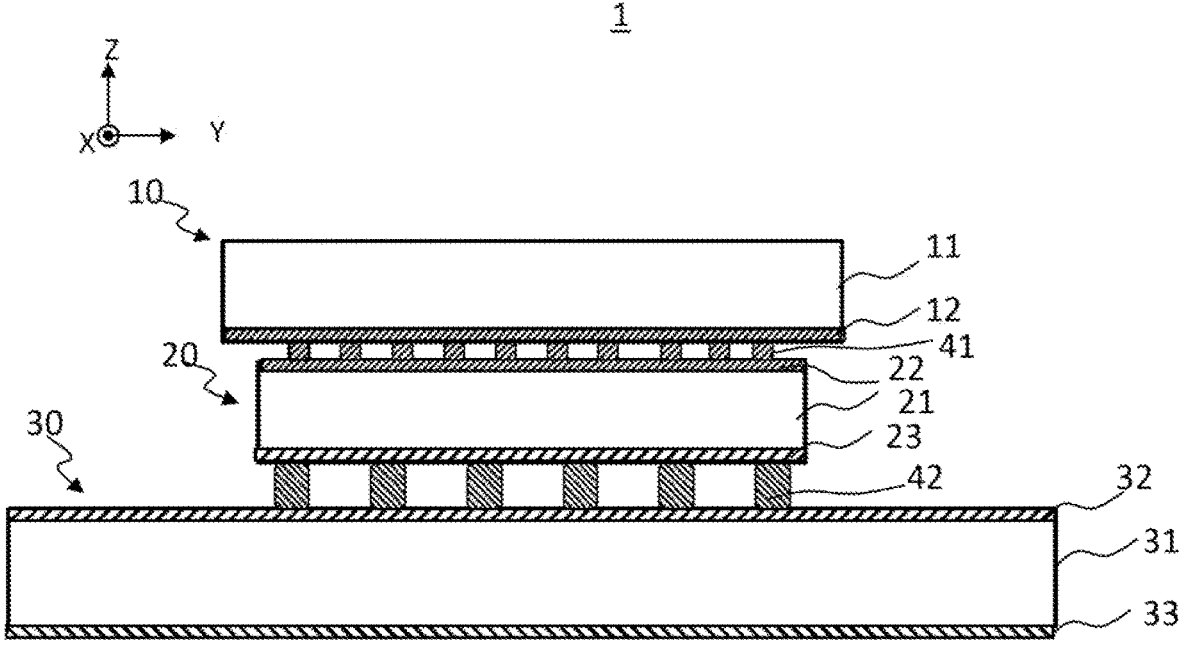
FIG. 2 is a side end view schematically illustrating the example embodiment.

FIG. 2 illustrates a schematic side end view of the quantum device 1 illustrated in FIG. 1, viewed from an x-axis direction. A wiring layer 12 formed on the substrate 11 of the quantum chip 10 is made of a superconducting material, such as Niobium (Nb). The superconducting material is not limited to niobium (Nb). Niobium nitride, aluminum (Al), indium (In), lead (Pb), tin (Sn), rhenium (Re), palladium (Pd), titanium (Ti), tantalum (Ta), tantalum nitride, or an alloy including at least any one of those aforementioned. The first connection portion 41 and the second connection portion 42, each of which is configured by a bump electrode (metal bump), will be referred to as a first bump electrode 41 and a second bump electrode 42, respectively in the following.

The wiring layer 12 formed on the first surface of the substrate 11 of the quantum chip 10 may include a non-linear element such as Josephson junction and an inductor (L) in a LC resonant circuit of a superconducting quantum circuit.

A first wiring layer 22 on a first surface of the first wiring substrate 20 facing the first surface (the wiring layer 12) of the quantum chip 10 may be made of a superconducting material. A part of the superconducting quantum circuit of the quantum chip 10 may also be formed in the first wiring layer 22 of the first wiring substrate 20. For example, a capacitor (C) of the LC resonant circuit of the superconducting quantum circuit may include a first electrode and a second electrode, where the first electrode is formed on the wiring layer 12 of the quantum chip 10, and the second electrode facing the first electrode may be formed on the first wiring layer 22 of the first wiring substrate 20.

The first bump electrode 41 may be fabricated on the first wiring layer 22 when manufacturing the first wiring substrate 20. In this case, the first bump electrode 41 may be bonded to a pad (connection terminal) of the wiring layer 12 of the quantum chip 10 by direct bonding through surface activation, ultrasonically bonding, or solder (superconducting solder) bonding. Alternatively, thermal compression bonding (TCB) or the like may be applied. Bonding of the first bump electrode 41 is preferably carried out before bonding of the second bump electrode 42.

Alternatively, the first bump electrode 41 may be fabricated on the wiring layer 12 when manufacturing the quantum chip 10. In this case, the first bump electrode 41 may be bonded to a pad in the first wiring layer 22 of the first wiring substrate 20 by direct bonding through surface activation, ultrasonically bonded, or solder (superconducting solder) bonding. Alternatively, thermal compression bonding or the like may be applied.

A diameter (crimp diameter) of the first bump electrodes 41 may be about several μm to several 10 μm, for example, 5 μm to 10 μm. A distance between centers of the first bump electrodes 41 (bump pitch) is also approximately equal to or greater than the diameter of the first bump electrode 41.

A second wiring layer 23 on the second surface of the first wiring substrate 20 facing the second wiring substrate 30, is connected to the first bump electrode 41 by a through via (not shown). In FIG. 2, the second wiring layer 23 is illustrated as a wiring layer extending from one end to another end of the substrate 21. The second wiring layer 23 includes via pads, a planner chape thereof being a circle or rectangle) of the through vias (not shown). The second wiring layer 23 may be made of a superconducting material or a non-superconducting material. For example, the second wiring layer 23 may have a surface coated with gold (Au), platinum (Pt), palladium (Pd), or the like.

The second wiring substrate 30 may be a multilayer substrate. A third wiring layer 32 of the second wiring substrate 30 facing the first wiring substrate 20 may be made of a non-superconducting material. A diameter of the second bump electrode 42 may be, for example, about 50 μm to 100 μm. The second bump electrode 42 may be formed on the second wiring layer 23 of the first wiring substrate 20. In this case, the second bump electrodes 40 are bonded on a wiring pad of the third wiring layer 32 of the second wiring substrate 30 by, for example, surface activation, ultrasonic waves, solder, or crimping.

A fourth wiring layer 33 of the second wiring substrate 30 may be made of a non-superconducting material. Of the fourth wiring layer 33, a signal wiring (e.g., readout line, control line, etc.) may be taken out from the refrigerator and connected, for example, to a measurement device installed in a room temperature area. The measurement device includes for example, a readout circuit or a current control circuit that supplies current to generate a magnetic flux to penetrate through the SQUID (superconducting quantum interference device) loop of a qubit.

In the substrate 21 of the first wiring substrate 20, one or more second bump electrodes 42 arranged in the first row (or the first one) as viewed from an edge of the second surface where the second wiring layer 23 is formed, are arranged corresponding to one or more first bump electrodes 41 arranged in the first row (or the first one) as viewed from an edge of the first surface where the first wiring layer 22 is formed. The one or more second bump electrodes 42 are arranged at positions each closer to the edge than that of each of the one or more corresponding first bump electrodes 41.

7

Figure 3A:
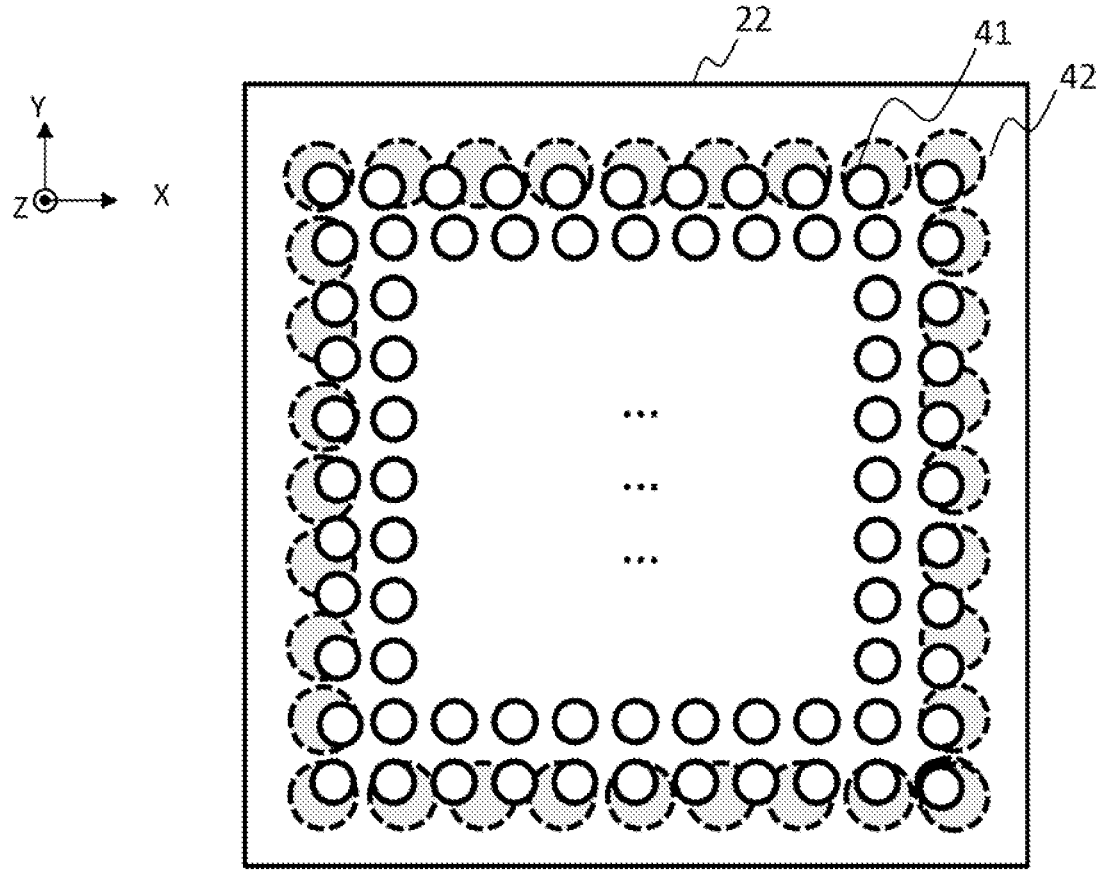
FIG. 3A and FIG. 3B are plan views schematically illustrating the example embodiment.

FIG. 3A is a schematic plan view of the first wiring layer 22 of the first wiring substrate 20 illustrated in FIG. 2. FIG. 3A schematically illustrates a part of area bumps where the first bump electrodes 41 are arranged in an area-array on a surface of the quantum chip 10 to be mounted by the flip-chip method. The first bump electrodes 41, which are connected to pads around the periphery of the quantum chip 10, are schematically illustrated on the first wiring layer 22 of the first wiring substrate 20. The second bump electrodes 42 (illustrated as a gray circle with a dashed line border) on the second wiring layer 23 (see FIG. 2) are arranged in the first row as viewed from an edge of the second surface where the second wiring layer 23 and are located at an outer peripheral side as compared with corresponding ones of the first bump electrodes 41 which are arranged in the first row as viewed from an edge of the first surface where the first wiring layer 22 is formed. In FIG. 3A, only the second bump electrodes 42 arranged on the most outer side of the second wiring layer 23 are illustrated and other second bump electrodes 42 (not shown) may be arranged inside the corresponding first bump electrodes 41. A placement pattern of the first bump electrodes 41 inside the periphery is arbitrary, and for this reason they are omitted in FIG. 3A.

Figure 3B:
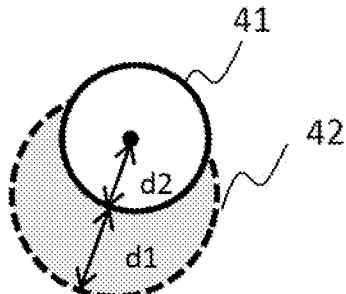

FIG. 3B illustrates a positioning of the first bump electrodes 41 and the second bump electrodes 42. FIG. 3B schematically illustrates the positioning of one first bump electrode 41 and one second bump electrode 42 in the lower left corner (corner) of the first wiring layer 22 in FIG. 3A. As illustrated in FIG. 3B, a distance $d_1$ is, for example, 0.2 times greater than a distance $d_2$ ($d_1>=0.2\times d_2$). The distance $d_1$ is a distance between the outermost positions of the second bump electrode 42 and the first bump electrode 41 when the second bump electrode 42 is projected on the same plane on which the first bump electrode 41 is located. The distance $d_2$ is a distance between the center position of the first bump electrode 41 and the outermost position of the first bump electrode 41. In the example illustrated in FIG. 3B, the first bump electrode 41 is of a cylindrical form (with a cross section being a circle), and $d_2$ is the radius of the first bump electrode 41. Preferably, $d_1>=(1/3)\times d_2$, or $d_1>=0.4\times d_2$.

In the substrate 21 of the first wiring substrate 20, a plurality of second bump electrodes 42, each of which is arranged in the first row as viewed from each of the four sides (edges) of the second surface where the second wiring layer 23 is formed, are arranged at positions closer to the end side than corresponding one of a plurality of first bump electrodes 41 arranged in the first row as viewed from each of the four sides (edges) of the first surface where the first wiring layer 22 is formed. With this configuration, the first connection portions 41 are arranged within a deformation suppression region defined by the second connection portions 42 that connect the first wiring substrate 20 and the second wiring substrate 30. Thus, deformation such as warping of the first wiring substrate 20 due to cooling to a cryogenic temperature can be suppressed. That is, according to the present example embodiment, in a configuration where there is not provided any underfill material or the like between the quantum chip 10 and the first wiring substrate 20 and between the first wiring substrate 20 and the second wiring substrate 30, it is possible to suppress deformation of the first wiring substrate and avoid a breakage of each connection portion, thereby improving a connection reliability between the first wiring substrate 20 and the second wiring substrate 30.

Figure 4A:
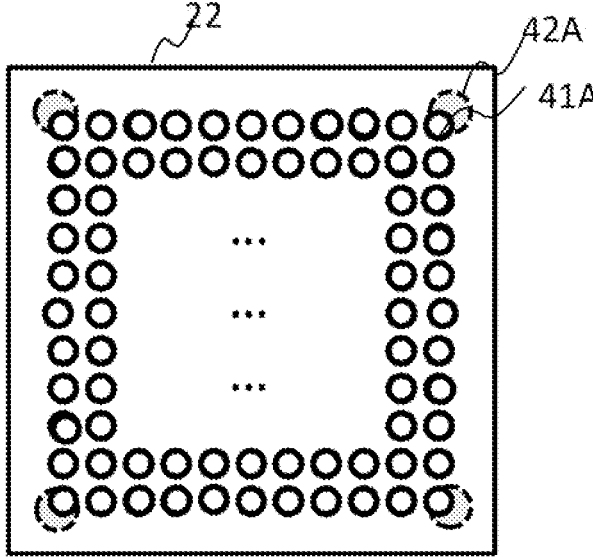
FIG. 4A to FIG. 4C are plan views schematically illustrating variation examples of the example embodiment illustrated in FIG. 3A.
Figure 4B:
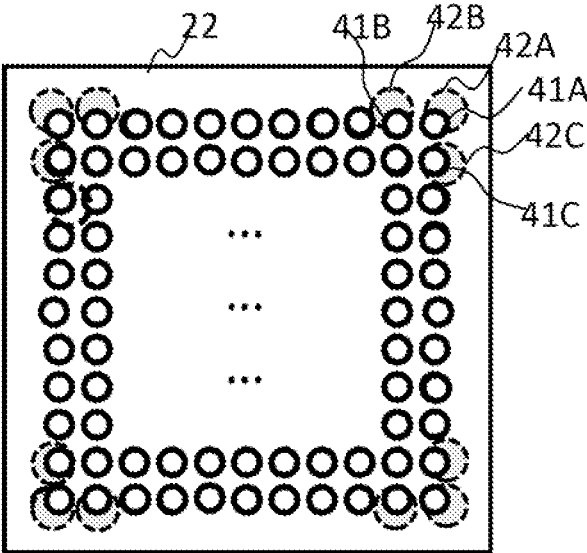
Figure 4C:
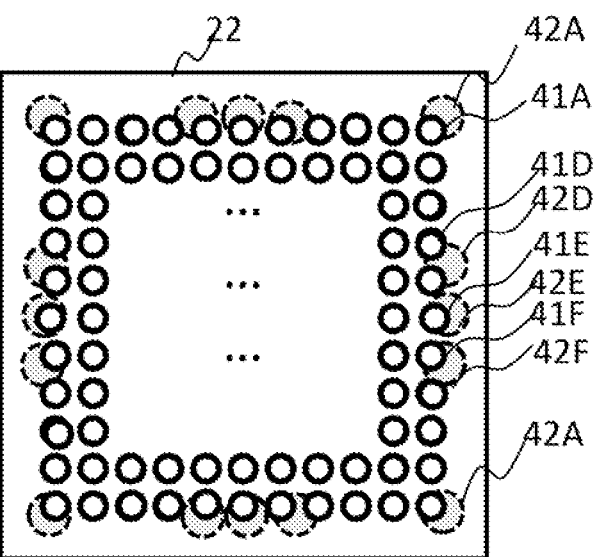

FIGS. 4A to 4C are schematic plan views of the first wiring layer 22 of the first wiring substrate 20 illustrated in FIG. 2. FIGS. 4A to 4C examples of variations in the arrangement of the second bump electrodes 42 illustrated in FIG. 3. In the example illustrated in FIG. 4A, in the substrate 21 of the first wiring substrate 20, each second bump electrode 42A (gray circle with dashed line border) located in the first position as viewed from an edge of each of four corners of the second surface where the second wiring layer 23 is formed, is arranged closer to the edge of each of the four corners than each corresponding one of the first bump electrodes 41A located in the first position as viewed from the edge of each of the four corners of the first surface of the where the first wiring layer 22 is formed.

In the example illustrated in FIG. 4B, in the substrate 21 of the first wiring substrate 20, the second bump electrodes 42A and at least one second bump electrode out of second bump electrodes 42B and 42C neighboring to the second bump electrode 42A are respectively arranged closer to the edge side than the corresponding first bump electrode 41A and at least one first bump electrode out of the first bump electrodes 41B and 41C neighboring to the first bump electrode 41A. The second bump electrode 42A is positioned first as viewed from an edge of each of four corners of the second surface where the second wiring layer 23 is formed, and the first bump electrode 41A is positioned first as viewed from an edge of each of the four corners of the first surface where the first wiring layer 22 is formed.

In the example illustrated in FIG. 4C, in the substrate 21 of the first wiring substrate 20, the second bump electrodes 42A arranged at a corner, and at least one second bump electrode out of second bump electrodes 42D, 42E, and 42F each arranged in a center portion of a side between the two opposing corners are arranged closer to the edge side than the corresponding first bump electrode 41A arranged at the corner, and at least one first bump electrode out of first bump electrodes 41D, 41E, and 41F each arranged in a center portion of a side between the two opposing corners, respectively. The second bump electrode 42A is positioned first as viewed from an edge of each of four corners of the second surface where the second wiring layer 23 is formed, and the first bump electrodes 41 is positioned first as viewed from the edge of each of the four corners of the first surface where the first wiring layer 22 is formed.

For each corner, a length of all of a plurality of the second bump electrodes 42 each positioned closer to an end side than a corresponding one of the first bump electrodes 41, which is given by (a diameter of the second bump electrode 42+a pitch between the second bump electrodes 42)×(the number of the second bump electrode 42 positioned closer to the end side than the first bump electrodes 41) may be about 1/3 or less, or 1/5 or less, of a length of all of the second bump electrodes 42 arranged along each side of the second surface where the second wiring layer 23 is formed.

Also, on each side of the second surface where the second wiring layer 23, a length of all of a plurality of the second bump electrodes 42 arranged in the center portion of the side and arranged closer to the end side than the first bump electrodes 41, which is given by (a diameter of the second bump electrode 42+a pitch between the second bump electrodes 42)×(the number of the second bump electrode 42 in the center portion of the side and arranged closer to the end side than the first bump electrodes 41) may be about 1/3 or less, or 1/5 or less, of a length of all of the second bump electrodes 42 arranged on one side.

Figure 5A:
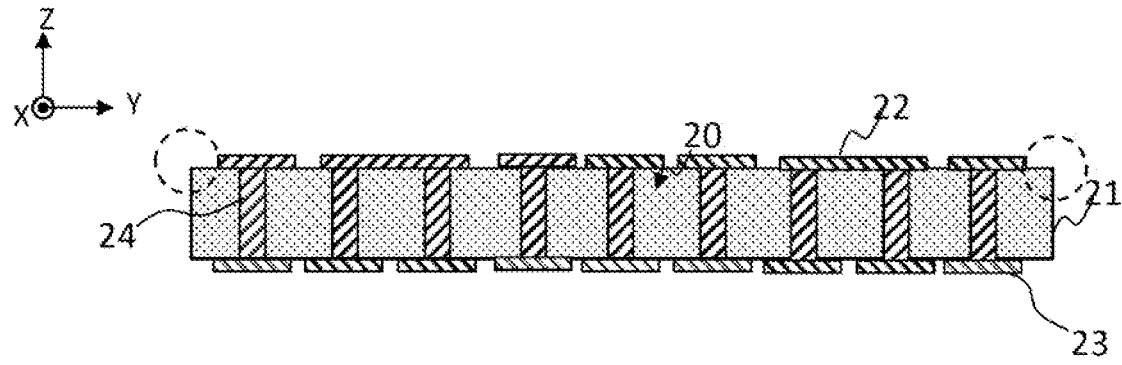
FIG. 5A is a cross section view schematically illustrating a first wiring substrate of the example embodiment.

FIG. 5A illustrate schematically a cross section of the first wiring substrate 20 illustrated in FIG. 2. A wiring (pad) of the first wiring layer 22 on the first surface of the first wiring substrate 20 and a wiring (pad) of the second wiring layer 23 on the second surface are connected by a through via (through-substrate via) 24 formed in the substrate 21.

When the substrate 21 is a silicon substrate, the through via 24 is also called TSV (through-silicon via) penetrating the silicon die (silicon wafer). The through via 24 is formed by drilling a hole in the wafer and filling a conductive material in the hole to form a through electrode. The conductive material filled in an inner wall of the hole of the through vias 24 can be either a superconducting material or a non-superconducting material (Cu, Ni, Au, Pt, etc.). The through via 24 may be formed on a first surface (front surface) of the wafer before the first wiring layer 22 is formed (via first), or formed from the first surface or a second surface (back surface) of the wafer after the first wiring layer 22 is formed (via last).

In FIG. 5A, dashed circles on both sides of the substrate 11 represent a substrate configuration such that exposure of anything other than a superconducting material on a first surface of the substrate 11 of the quantum chip 10 (exposure of the first surface of the substrate 11) may be avoided as much as possible. That is, a wiring pattern of the first wiring layer 22 covers up to an end portion (edge) of the substrate 21. On the first surface of the substrate 11, in the wiring pattern of the first wiring layer 22 includes a ground pattern (plane) arranged to surround both sides of a signal line waveguide. Therefore, the first surface of substrate 11 is configured such that a wide area (region) thereof is not exposed.

In order to reduce warpage of the substrate 21, the first and second surfaces are provided with the same number of wiring layers (first and second wiring layers 22 and 23) thereon. If warpage can be controlled by a layout and thickness of the wiring layers, the wiring layer 23 facing to the second wiring substrate 30 may be configured as multiple layers.

In an example illustrated in FIG. 5A, in first wiring substrate 20, the second wiring layer 23 includes a via pad of the through via 24, i.e., a pad electrode (connection terminal) directly below the through via 24.

Figure 5B:
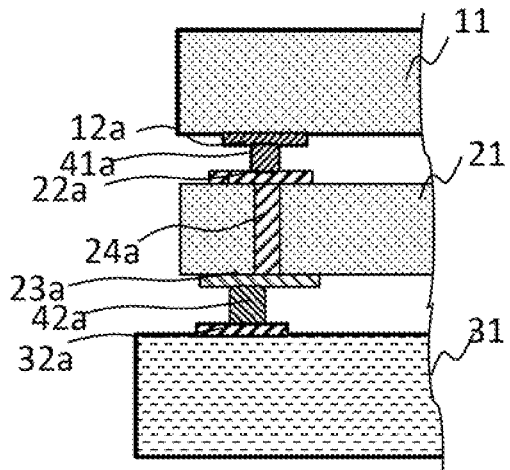
FIG. 5B and FIG. 5C are diagrams illustrating a first wiring substrate.

Regarding the second connection portions (second bump electrode) 42, for example, as illustrated in FIG. 5B, in the first wiring substrate 20, a second connection portion (second bump electrode) 42a, which is located at the outermost periphery of the second connection portions 42 connected to the wiring of the wiring layer 31 of the second wiring substrate 30 may be shifted outward from a position of a first connection portion (first bump electrode) 41a, which is connected via a through via 24a. In this case, a planar shape of a via pad 23a (wiring) directly below the through via 24a may have a shape that extends outward from a center of the through via 24a, and a positioning of the first and second connection portions (first and second bumps) 41 and 42 may have a positioning relationship as illustrated in FIG. 3B. Alternatively, the outermost second connection portion (second bump electrode) 42a may be configured such that a position of the first connection portion (first bump electrode) 41a which is located in a center of the via pad 23a of the through via 24a and connected via the through via 24a, is located inside the outermost positioned second connection portion (second bump electrode).

Figure 5C:
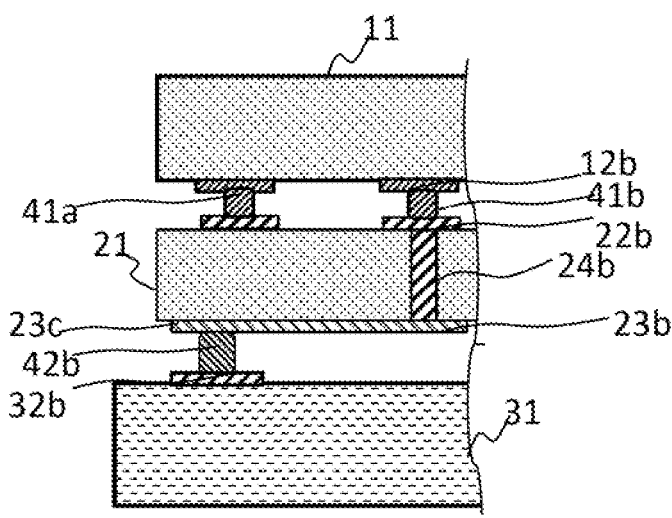

In a case where in the first wiring substrate 20, a connection is made with the wiring of the wiring layer 32 of the second wiring substrate 30, and the second connection portion (second bump electrode) 42 connecting to the first surface of the connection portion (first bump electrode) 41 via the through via 24 is connected directly under the through via 24, a signal connection is made at a shortest distance, though not limited thereto. For example, as illustrated in FIG. 5C, on the second surface of the substrate 21 of the first wiring substrate 20, a via pad 23b of a through via 24b may be wire routed to a pad electrode (connection terminal) 23c, and the second connection portion (second bump electrode) 42b located at the outermost periphery of the second connection portions (second bump electrodes) 42 may be bonded to the pad electrode 23c. The via pad 23b is located inside, extending inward, from an edge of the substrate 21. The pad electrode 23c is located at the outermost position separated from the position of the through via 24b. In this case, the second connection portion (second bump electrode) 42b is located outside of an outermost first connection portion (first bump electrode) 41a. A wiring routing and a pad electrode may be formed by patterning the through via 24 with a process such as forming it from the second surface of the substrate 21.

Figure 6:
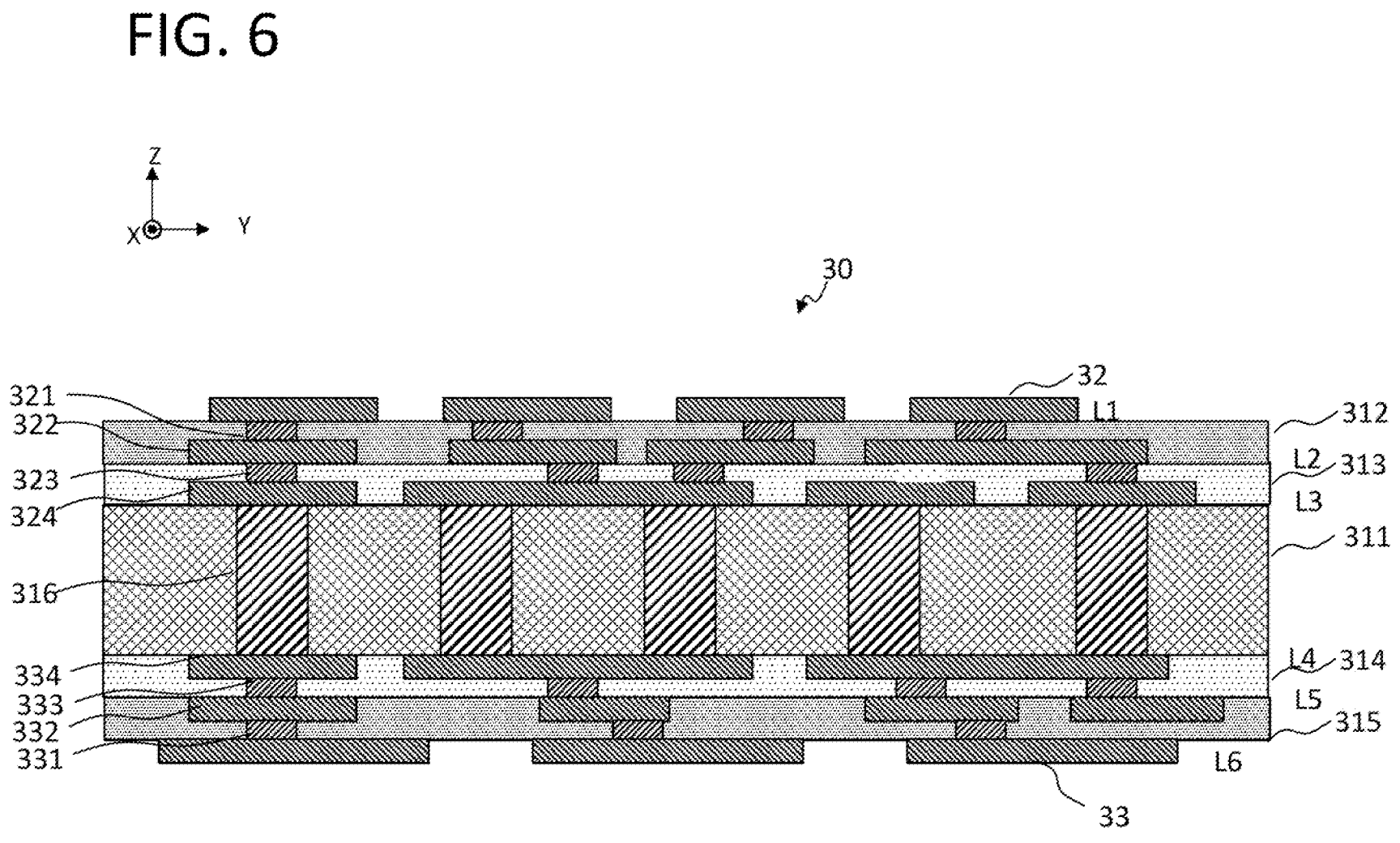

FIG. 6 schematically illustrates a cross section of the second wiring substrate 30 illustrated in FIG. 2. As illustrated in FIG. 6, the second wiring substrate 30 is configured as a 6-layer multilayer substrate with a configuration, in which, a conductor 324, an insulation layer 313, a conductor 322, an insulation layer 312, and a conductor of the third wiring layer 32 are stacked on a first surface of a core material 311, the third wiring layer 32 and the conductor 322 are connected with a via 321, the conductor 322 and the conductor 324 are connected with a via 323, a conductor 334, an insulation layer 314, a conductor 332, an insulation layer 315, a conductor of a fourth wiring layer 33 are stacked on a second surface opposite to the first surface of the core material 311, the conductor of the fourth wiring layer 33 and the conductor 332 are connected with a via 331, the conductor 332 and the conductor 334 are connected with a via 333, and the conductor 324, the conductor 334 are connected with a through via 316 penetrating the core material 311. The core material 311 is made of a silicon substrate to have the same linear thermal expansion coefficient as the substrate 11 of the quantum chip 10. and the substrate 21 of the first wiring substrate 20. In this case, the through via 316 is configured with a TSV. Configurations of a wiring layer and an insulation layer on both sides of the core material 311 is the same to suppress warpage of the substrate. Conductors to be built up may be, for example, copper (Cu) or aluminum, etc. Silicon oxide, silicon nitride, silicon oxynitride, polyimide resin, acrylic resin, epoxy resin, fluorine resin (Poly Tetra Fluoro Etylene (PTFE)), or the like may be used as insulation layers.

Figure 7A:
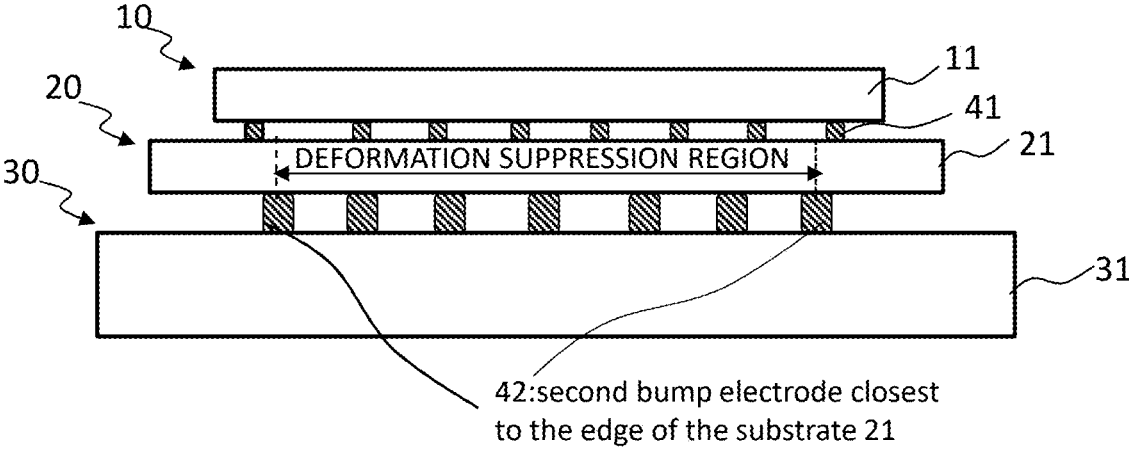
FIG. 7A and FIG. 7B are diagrams schematically illustrating comparative examples.
Figure 7B:
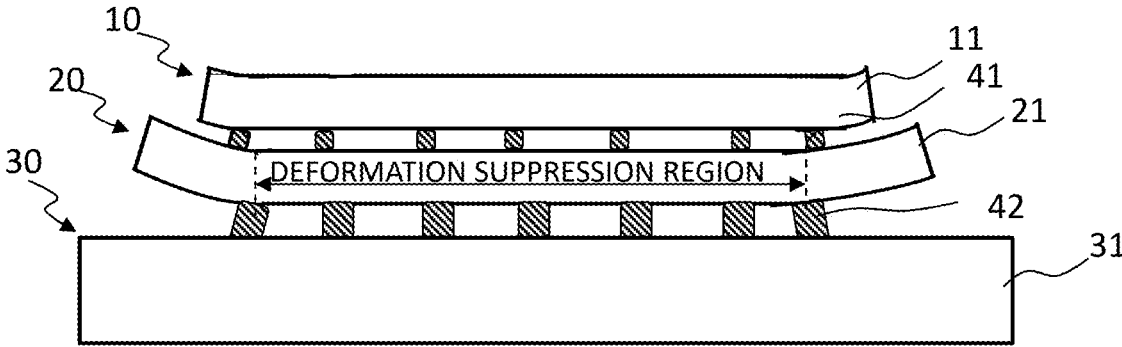
Figure 7C:
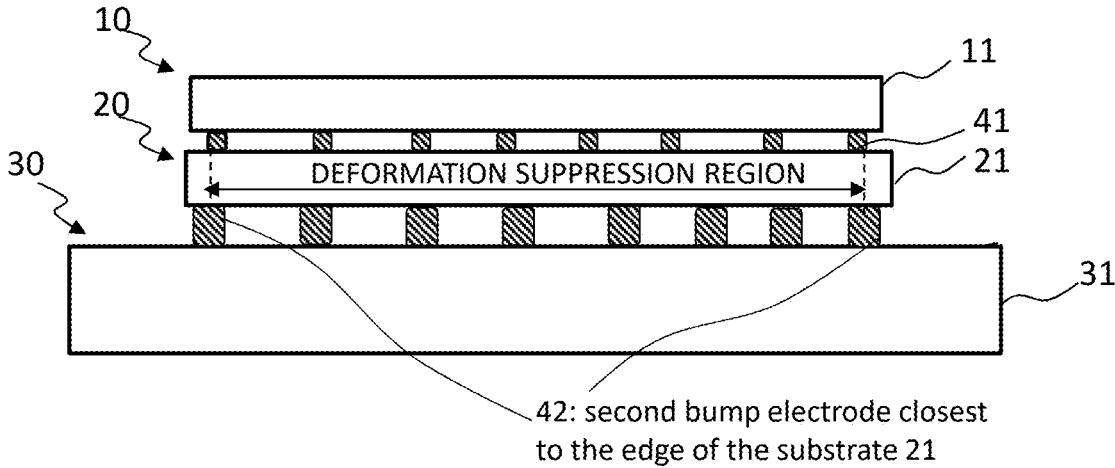
FIG. 7C is a diagram schematically illustrating the example embodiment.

FIG. 7A to FIG. 7C schematically illustrate a comparative example and an example embodiment. FIG. 7A schematically illustrate a configuration of the comparative example. In the first wiring substrate 20, regarding the first bump electrode 41 that connect to the quantum chip 10, there are first bump electrodes 41, which are located outside of the deformation suppression region defined as an inside region encircled by the second bump electrodes 42 arranged closest to the edge (outmost) of the substrate 21.

Since the quantum chip 10 and the substrates 11 and 21 of the first wiring substrate 20 are each made of a silicon substrate, coefficients of linear thermal expansion of the quantum chip 10 and the substrates 11 and 21 of the first wiring substrate 20 are the same when cooled to the cryogenic temperature. In the substrate 21 of the first wiring substrate 20, in a region inside the second bump electrodes 42 (deformation suppression region) arranged outmost, deformation with large curvature is suppressed due to a constraining force from the second bump electrode 42.

On the other hand, in an area outside the deformation suppression region in the substrate 21 of the first wiring substrate 20, ranging from the second bump electrodes 42 arranged closest to the edge (outmost) of the substrate 21 to the edge of the substrate 21 is an unbounded free end, in which unlike inside the deformation suppression region, a large curvature deformation (warpage) may occur, as shown schematically in FIG. 7B. An amount of substrate warpage is known to depend on Young's modulus (modulus of longitudinal elasticity) E of a substrate material, Poisson's ratio v, substrate thickness (inversely proportional to the square of the substrate thickness), substrate length (proportional to the square of the length), linear expansion coefficient (difference thereof), temperature change, etc.

An amount of deformation (warpage) due to a change in temperature from room temperature to cryogenic temperature becomes more remarkable as the substrate 21 of the first wiring substrate 20 becomes thinner, which may result in a connection failure or other faults in the second bump electrodes 42. In an example illustrated in FIG. 7B, an area extending from the first bump electrodes 41 closest to the end (outmost) of the substrate 11 of the quantum chip 10 to an edge of the substrate 11 is an unbounded area (free end) in which warpage due to thermal contraction and other factors may cause the outermost first bump electrode 41 to tilt, resulting in a connection failure and other faults due to stripping of the junction portion (electrode peeling) and other problems. FIG. 7B schematically illustrates a large curvature warpage of the unbounded free end of the first wiring substrate 20, while a warpage of the second wiring substrate 30 is not shown. This is because the warpage of the second wiring substrate 30 varies depending on thickness, size, material, etc.

When the second bump electrode 42 closest to the edge (outmost) of the substrate 21 of the first wiring substrate 20 is a ground bump, since many ground bumps are provided, the warpage of the unbounded free end of the first wiring substrate 20 will not necessarily incur a failure. The second bump electrode 42, as a ground bump, connects a planer ground pattern (plane) in the second wiring layer 23 of the second wiring substrate 20 and a planer ground pattern (plane) in the third wiring layer 33 of the third wiring substrate 30. However, in the case of a bump for signal transmission (signal bump), the warpage of the unbounded free end of the first wiring substrate 20 directly leads to signal characteristic degradation and failure such as wiring breakage.

FIG. 7C schematically illustrates a configuration of the present example embodiment, corresponding to FIG. 7A. In the first wiring substrate 20, regarding the first bump electrode 41 that connects to the quantum chip 10, the first bump electrode 41 is located inside of the deformation suppression region defined inside the second bump electrodes 42 closest to an edge (outmost) of the substrate 21. A length of the unbounded free area (end) extending from the second bump electrode 42 closest to an edge (outmost) of the substrate 21 to the edge of the substrate 21 is shorter than that in FIG. 7A.

By shortening the length (predetermined length) of the area (free edge) where not bounded by the second bump electrodes 42, deformation with a large curvature during heat shrinkage is suppressed. A predetermined length can be obtained by thermal stress analysis, etc. Similarly, for quantum chip 10, by shortening the length of unbounded free edge from the first bump electrodes 41 at the most end portion side (outside) of the substrate 11 of the quantum chip 10 to the end portion of the substrate 11 as much as possible, deformation with a large curvature during heat shrinkage is suppressed. Even when the second bump electrode 42 at the most end portion side (outside) of the substrate 21 of the first wiring substrate 20 is a bump for signal transmission (signal bump), deformation such as warping of the substrate 21 is suppressed to ensure connection reliability and avoid deterioration of signal characteristics.

It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual claims, the individual elements of the individual examples and the individual elements of the individual figures) within the scope of the Claims of the present invention. That is, it is self-explanatory that the present invention includes any types of variations and modifications to be done by a skilled person according to the whole disclosure including the Claims, and the technical concept of the present invention.

What is claimed is:

1. A quantum device, comprising:
   a chip including:
   a substrate; and
   a wiring layer made of superconducting material on the substrate;
   a first wiring substrate including:
   a first substrate;
   a first wiring layer on a first surface of the first substrate;
   a second wiring layer on a second surface of the first substrate opposite the first surface of the first substrate; and
   a plurality of through vias penetrating the first substrate between on the first wiring layer and the second wiring layer; and
   a second wiring substrate including:
   a second substrate; and
   a third wiring layer formed on a first surface of the second substrate;
   a plurality of first connection portions bonded between the wiring layer of the chip and the first wiring layer on the first surface of the first substrate arranged opposed to the chip; and
   a plurality of second connection portions bonded between the second wiring layer on the second surface of the first substrate and the third wiring layer on the first surface of the second substrate arranged opposed to the second surface of the first substrate, wherein, in the first wiring substrate,
   the plurality of second connection portions on the second surface of the first substrate include
   one or more second connection portions arranged in a first row as viewed from an edge of the first substrate and corresponding respectively to one or more first connection portions on the first surface of the first substrate arranged in a first row as viewed from the edge of the first substrate, the one or more second connection portions respectively positioned closer to the edge than the one or more first connection portions on the first surface of the first substrate arranged in the first row, wherein, in the first wiring substrate,
   the plurality of second connection portions on the second surface of the first substrate include
   at least one second connection portion on the second surface arranged in the first row as viewed from the edge of the first substrate, and the plurality of first connection portions on the first surface of the first substrate include:

at least one first connection portion corresponding to the at least one second connection portion on the first surface arranged in the first row as viewed from the edge of the first substrate, the at least one second connection portion located closer to the edge than the at least one first connection portion, a distance between a second position of the at least one second connection portion on the second surface, and a first position of the at least one first connection portion on the first surface, the second position being a closest position of the second connection portion to the edge, the first position being a closest position of the first connection portion to the edge, with the second position on the second surface and the first position on the first surface projected on a same plane is set to a predetermined ratio or more of a distance between a center of the at least one first connection portion and the first position.

2. The quantum device according to claim 1, wherein, in the first wiring substrate, the plurality of second connection portions on the second surface of the first substrate includes at least one second connection portion on the second surface positioned first as viewed from an edge of at least one corner of four corners of the first substrate, is arranged closer to the edge of the at least one corner of the four corners than the corresponding first connection portion on the first surface positioned first as viewed from the edge of the at least one of the four corners.

3. The quantum device according to claim 1, wherein in the first wiring substrate, the plurality of second connection portions on the second surface of the first substrate include:

at least one second connection portion on the second surface positioned first as viewed from an edge of a first corner of the first substrate; and at least another second connection portion on the second surface arranged in the first row as viewed from a side between neighboring two corners of the first substrate, the neighboring two corners including the first corner, wherein the plurality of first connection portions on the first surface of the first substrate include:

at least one first connection portion on the first surface positioned first as viewed from an edge of the first corner of the first substrate; and at least another first connection portion on the first surface arranged in the first row as viewed from a side between the neighboring two corners, the at least one second connection portion and the at least another second connection portion on the second surface located respectively closer to the edge than the at least one first connection portion and the at least another first connection portion on the first surface.

4. The quantum device according to claim 1, wherein, in the first wiring substrate, the plurality of second connection portions on the second surface of the first substrate include plural second connection portions on the second surface arranged in the first row as viewed from each side of the first substrate respectively closer to the each side than corresponding plural first connection portions on the first surface arranged in the first row as viewed from the each side of the first substrate.

5. The quantum device according to claim 1, wherein, in the first wiring substrate, the second wiring layer on the second surface includes:

a first connection terminal provided at an end of a first through via penetrating the first substrate; and/or a second connection terminal arranged at a position different from a position directly under a second through via penetrating the first substrate with a wiring routed from the second through via to the position, wherein the plurality of second connection portions on the second surface of the first substrate include a second connection portion having one end connected to a wiring pad of the third wiring layer of the second wiring substrate and having another end joined to the first connection terminal or the second connection terminals on the second face of the first substrate.

6. The quantum device according to claim 1, wherein the predetermined ratio is one-fifth or one-third.

7. The quantum device according to claim 1, wherein the plurality of first connection portions and the plurality of second connection portions each include a bump electrode.

8. The quantum device according to claim 1, wherein each of the plurality of first connection portions has a diameter smaller than a diameter of each of the plurality of second connection portions.

9. The quantum device according to claim 1, wherein the chip and the first wiring substrate include each a silicon substrate.

10. The quantum device according to claim 1, wherein the second wiring substrate is a multilayer substrate including a silicon substrate as a core material, and alternately laminated insulation layers and conductor layers formed on both sides of the core material, a lamination number being same on the both sides.

11. The quantum device according to claim 1, wherein the chip is flip-chip mounted on the first wiring substrate.

* * * * *